(12) United States Patent
Choi et al.

(10) Patent No.: US 12,029,094 B2
(45) Date of Patent: Jul. 2, 2024

(54) DISPLAY DEVICE INCLUDING PLANARIZATION LAYER CONTACTING LIGHT BLOCKING PORTION AND COLOR FILTER LAYER

(71) Applicant: Samsung Display Co., Ltd., Yongin-Si (KR)

(72) Inventors: Nak Cho Choi, Yongin-si (KR); Baek Min Oh, Seoul (KR); Eon Joo Lee, Hwaseong-si (KR); Hae Young Yun, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 315 days.

(21) Appl. No.: 17/228,849

(22) Filed: Apr. 13, 2021

(65) Prior Publication Data

US 2022/0069014 A1 Mar. 3, 2022

(30) Foreign Application Priority Data

Aug. 28, 2020 (KR) ........................ 10-2020-0109228

(51) Int. Cl.
*H10K 50/82* (2023.01)
*H10K 50/84* (2023.01)
(Continued)

(52) U.S. Cl.
CPC ........... *H10K 59/38* (2023.02); *H10K 50/844* (2023.02); *H10K 59/40* (2023.02);
(Continued)

(58) Field of Classification Search
CPC . H01L 27/322; H01L 27/323; H01L 27/3216; H01L 27/3246; H01L 27/3248;
(Continued)

(56) References Cited

U.S. PATENT DOCUMENTS 11,068,096 B2\* 7/2021 Park ........................ G06F 3/047
2011/0284898 A1\* 11/2011 Iwasaki ................ H10K 50/844
257/98

(Continued)

FOREIGN PATENT DOCUMENTS

EP 3425691 A1 \* 1/2019 .......... H10K 59/121
KR 10-2018-0036847 A 4/2018
(Continued)

*Primary Examiner* — Ida M Soward
(74) *Attorney, Agent, or Firm* — Innovation Counsel LLP

(57) ABSTRACT

Provided is a display device. The display device includes a substrate, a light emitting diode that is disposed on the substrate, and includes a pixel electrode, a common electrode, and an emission layer disposed between the pixel electrode and the common electrode; an encapsulation layer that is disposed on the light emitting diode, a touch electrode that is disposed on the encapsulation layer, a light blocking portion that is disposed on the touch electrode, a color filter layer that overlaps the emission layer, and a planarization layer that is disposed on the light blocking portion and the color filter layer, wherein the color filter layer is disposed on the encapsulation layer and the light blocking portion, and an edge portion of the color filter layer overlaps the light blocking portion.

14 Claims, 17 Drawing Sheets

(51) Int. Cl.
*H10K 50/844* (2023.01)
*H10K 59/12* (2023.01)
*H10K 59/38* (2023.01)
*H10K 59/40* (2023.01)
*H01L 27/146* (2006.01)
*H10K 50/828* (2023.01)
*H10K 59/121* (2023.01)
*H10K 59/126* (2023.01)
*H10K 59/131* (2023.01)
*H10K 59/35* (2023.01)
*H10K 102/00* (2023.01)

(52) U.S. Cl.
CPC .............. *G09G 2300/0408* (2013.01); *G09G 2300/0804* (2013.01); *H01L 27/14678* (2013.01); *H10K 50/828* (2023.02); *H10K 59/1216* (2023.02); *H10K 59/126* (2023.02); *H10K 59/131* (2023.02); *H10K 59/35* (2023.02); *H10K 2102/00* (2023.02)

(58) Field of Classification Search
CPC ............. H01L 27/3276; H01L 27/3265; H01L 27/3272; H01L 27/3211; H01L 27/3297; H01L 27/14678; H01L 51/5253; H01L 51/5275; H01L 51/5284; H01L 51/5246; H01L 51/5234; H01L 2251/301; H01L 2251/5315; H01L 2251/558; G02F 1/133357; G02F 1/136209; G06F 3/0446; G06F 2203/0411; G02B 5/201; G09G 2300/0408; G09G 2300/0804; H10K 50/844; H10K 50/828; H10K 50/865; H10K 50/858; H10K 50/8426; H10K 59/38; H10K 59/40; H10K 59/1216; H10K 59/126; H10K 59/131; H10K 59/35; H10K 59/352; H10K 59/122; H10K 59/123; H10K 2102/00; H10K 2102/3026; H10K 2102/351
See application file for complete search history.

(56) References Cited

U.S. PATENT DOCUMENTS

| | | | |
|---|---|---|---|
| 2016/0285039 A1* | 9/2016 | Kim | G06F 3/0412 |
| 2018/0095570 A1* | 4/2018 | Hong | G06F 3/0446 |
| 2018/0182816 A1* | 6/2018 | Kang | G06F 3/0443 |
| 2018/0197921 A1* | 7/2018 | Kim | H10K 50/865 |
| 2019/0165325 A1* | 5/2019 | Lee | H10K 59/38 |
| 2019/0221779 A1* | 7/2019 | Jang | H10K 59/38 |
| 2019/0341428 A1* | 11/2019 | Lee | H10K 50/125 |
| 2020/0066804 A1* | 2/2020 | Jung | H10K 50/858 |
| 2020/0091247 A1* | 3/2020 | Lee | G06F 3/0443 |
| 2020/0111856 A1* | 4/2020 | Lee | H10K 59/40 |
| 2020/0119113 A1* | 4/2020 | Lee | H10K 50/8445 |
| 2020/0243802 A1* | 7/2020 | Ju | H01L 27/3272 |
| 2020/0274103 A1* | 8/2020 | Ishizuya | H10K 59/38 |
| 2020/0321406 A1* | 10/2020 | Lee | H01L 27/323 |
| 2020/0403039 A1* | 12/2020 | Park | G06F 3/0446 |
| 2021/0026473 A1* | 1/2021 | Kim | G06F 3/04164 |
| 2021/0175468 A1* | 6/2021 | Lee | H10K 50/844 |
| 2021/0242423 A1 | 8/2021 | Lee | |
| 2021/0359012 A1 | 11/2021 | Im et al. | |
| 2021/0397806 A1* | 12/2021 | Lu | G06F 3/0446 |

FOREIGN PATENT DOCUMENTS

| | | |
|---|---|---|
| KR | 10-2018-0082661 A | 7/2018 |
| KR | 10-2019-0086605 A | 7/2019 |
| KR | 10-2020-0042981 A | 4/2020 |
| KR | 10-2020-0051883 A | 5/2020 |
| KR | 10-2021-0070461 A | 6/2021 |
| KR | 10-2021-0099246 A | 8/2021 |
| KR | 10-2021-0142051 A | 11/2021 |

* cited by examiner

# DISPLAY DEVICE INCLUDING PLANARIZATION LAYER CONTACTING LIGHT BLOCKING PORTION AND COLOR FILTER LAYER

CROSS-REFERENCE TO RELATED APPLICATION

This application claims priority to and the benefit of Korean Patent Application No. 10-2020-0109228 filed in the Korean Intellectual Property Office on Aug. 28, 2020, the entire contents of which are incorporated herein by reference.

BACKGROUND

1. Field

The present disclosure relates to a display device. More particularly, the present disclosure relates to a display device that can improve front light emission efficiency and display quality.

2. Description of the Related Art

As a device that displays a screen, a display device includes a liquid crystal display (LCD), an organic light emitting diode (OLED) display, and the like. Such display devices are used in various electronic devices such as portable telephones, navigation devices, digital cameras, electronic books, portable game devices, and various terminals.

The display device is formed of a multi-layer structure. For example, the display device may be formed of a multi-layer structure in which a light emitting element, a touch sensor, and the like are stacked on a substrate. Light generated by the light emitting element passes through these layers and is emitted to the outside of the display device, thereby displaying a screen. However, some of the light generated by the light emitting element may not be emitted to the outside, such as that being reflected from an interlayer interface, and may disappear. Accordingly, there is a problem of deteriorating the display device's front light emission efficiency and display quality.

The above information disclosed in this Background section is only for enhancement of understanding of the background of the described technology, and therefore it may contain information that does not form the prior art that is already known in this country to a person of ordinary skill in the art.

SUMMARY

Example embodiments have made an effort to provide a display device that can improve front light emission efficiency and display quality.

A display device according to an example embodiment includes a substrate; a light emitting diode that is disposed on the substrate, and includes a pixel electrode, a common electrode, and an emission layer disposed between the pixel electrode and the common electrode; an encapsulation layer that is disposed on the light emitting diode; a touch electrode that is disposed on the encapsulation layer; a light blocking portion that is disposed on the touch electrode; a color filter layer that overlaps the emission layer; and a planarization layer that is disposed on the light blocking portion and the color filter layer, wherein the color filter layer is disposed on the encapsulation layer and the light blocking portion, and an edge portion of the color filter layer overlaps the light blocking portion.

A refractive index of the planarization layer may be higher than a refractive index of the color filter layer.

A refractive index of the planarization layer may be 1.65 or more and 2.0 or less.

A refractive index of the color filter layer may be about 1.5 or more and about 1.7 or less.

The color filter layer may have a concave shape in a center portion thereof.

A height of the center portion of the color filter layer may be lower than a height of an edge portion of the color filter layer.

The planarization layer may include an organic insulating material and a nano-composite.

The planarization layer may include at least one of $TiO_2$, $Al_2O_3$, $SiO_2$, $Al_2TiO_3$, $ZrO_2$, PbS, and ZnS.

The color filter layer may include a first color filter and a second color filter, and the first color filter and the second color filter may at least partially overlap each other.

An edge of the first color filter may overlap an edge of the second color filter.

The first color filter and the second color filter may overlap on the light blocking portion.

A display device according to an example embodiment includes a substrate; a light emitting diode that is disposed on the substrate, and includes a pixel electrode, a common electrode, and an emission layer that is disposed between the pixel electrode and the common electrode; an encapsulation layer that is disposed on the light emitting diode, and includes a groove; a color filter layer that is disposed on the encapsulation layer, and is disposed to fill inside the groove; a touch electrode that is disposed on the color filter layer; a light blocking portion that is disposed on the touch electrode; and a planarization layer that is disposed on the light blocking portion and the color filter layer.

The groove may overlap the emission layer, and the light blocking portion overlaps a plurality of color filter layers.

A refractive index of the color filter layer may be higher than a refractive index of the encapsulation layer.

The refractive index of the color filter layer may be 1.65 or more and 2.0 or less.

A display device according to an example embodiment includes: a substrate; a light emitting diode that is disposed on the substrate, and includes a pixel electrode, a common electrode, and an emission layer disposed between the pixel electrode and the common electrode; an encapsulation layer that is disposed on the light emitting diode; a touch electrode that is disposed on the encapsulation layer; a light blocking portion that is disposed on the touch electrode; a color filter layer that is disposed on the encapsulation layer and the light blocking portion, and overlaps the emission layer; and a planarization layer that is disposed on the light blocking portion and the color filter layer, wherein a height of a center portion of the color filter layer is lower than a height of an edge portion of the color filter layer.

A refractive index of the planarization layer may be higher than a refractive index of the color filter layer.

A refractive index of the planarization layer may be 1.65 or more and 2.0 or less.

The planarization layer may include an organic insulating material and a nano-composite.

The planarization layer may include at least one of $TiO_2$, $Al_2O_3$, $SiO_2$, $Al_2TiO_3$, $ZrO_2$, PbS, and ZnS.

A display device according to an example embodiment includes a substrate; a light emitting diode that is disposed on the substrate, and includes a pixel electrode, a common electrode, and an emission layer disposed between the pixel electrode and the common electrode; an encapsulation layer that is disposed on the light emitting diode; a touch electrode that is disposed on the encapsulation layer; a black matrix that is disposed on the touch electrode; a color filter layer that overlaps the emission layer; and a planarization layer that is disposed on the black matrix and the color filter layer, wherein the color filter layer is disposed on the encapsulation layer and the black matrix, and an edge portion of the color filter layer overlaps the black matrix.

According to the example embodiments, it is possible to improve front light emission efficiency and display quality.

DETAILED DESCRIPTION

Figure 1:
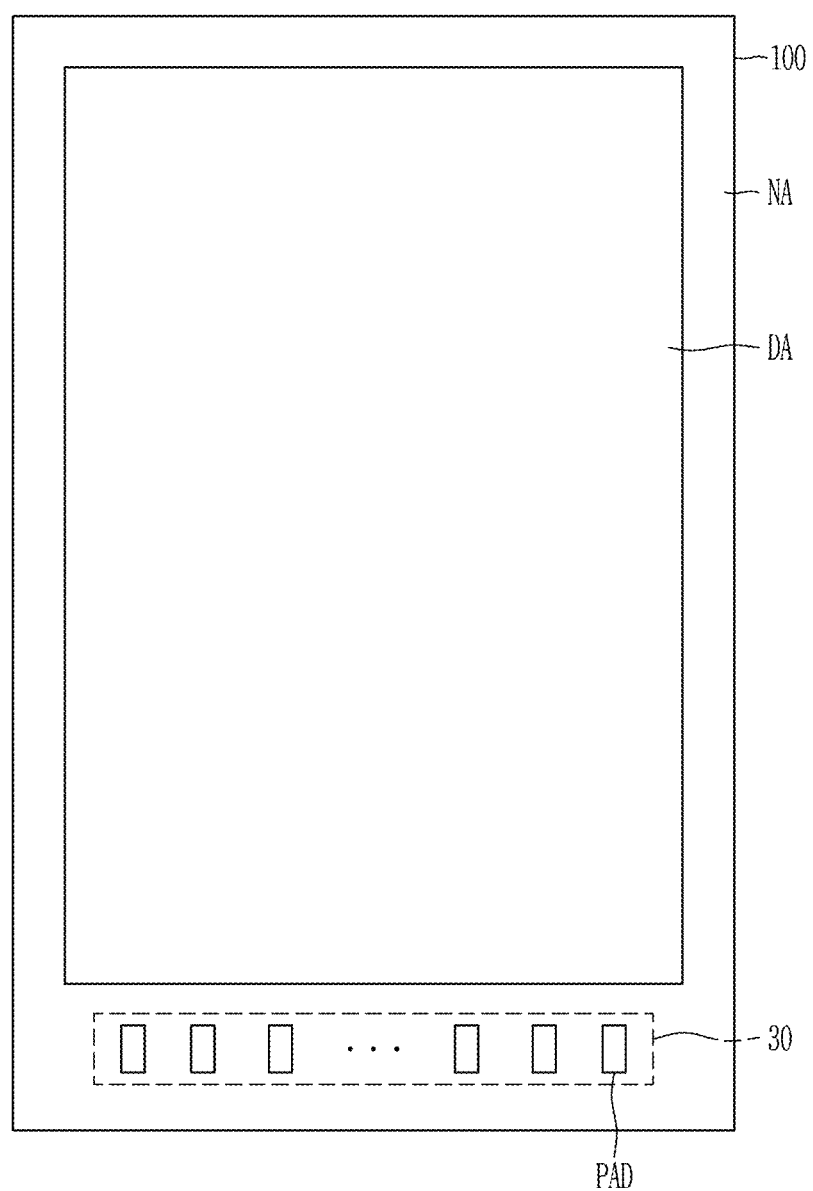
FIG. 1 is a schematic top plan view of a display device according to an example embodiment.

The present disclosure will be described more fully hereinafter with reference to the accompanying drawings, in which example embodiments of the present disclosure are shown. As those skilled in the art would realize, the described embodiments may be modified in various different ways, all without departing from the spirit or scope of the present disclosure.

The drawings and description are to be regarded as illustrative in nature and not restrictive. Like reference numerals designate like elements throughout the specification.

In the drawings, size and thickness of each element are arbitrarily illustrated for convenience of description, and the present disclosure is not necessarily limited to as illustrated in the drawings. In the drawings, the thickness of layers, films, panels, regions, etc., are exaggerated for clarity. In addition, in the drawings, for better understanding and ease of description, the thicknesses of some layers and regions are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to be positioned above or below the target element, and will not necessarily be understood to be positioned "at an upper side" based on an opposite to gravity direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Hereinafter, a display device according to an example embodiment will be described with reference to FIG. 1 and FIG. 2.

Figure 2:
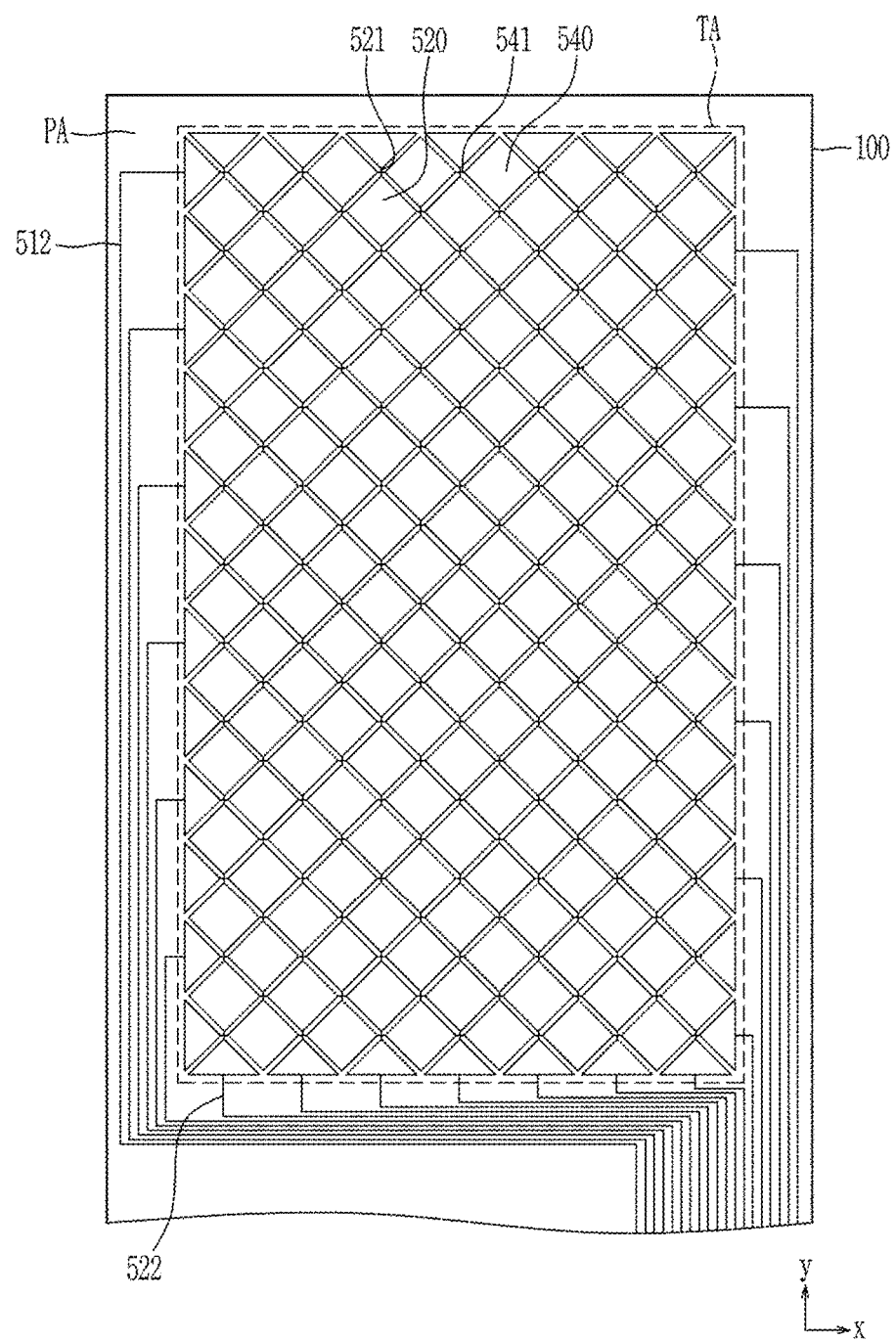
FIG. 2 is a top plan view of a portion including a detection portion in the display device according to the example embodiment.

FIG. 1 is a schematic top plan view of a display device according to an example embodiment, and FIG. 2 is a top plan view of a portion including a detection portion in the display device according to the example embodiment.

As shown in FIG. 1, a display device according to an example embodiment includes a substrate 100 and a pad portion 30.

The substrate 100 includes a display area DA and a non-display area NA. The display area DA is an area where pixels, each including a light emitting diode and a transistor are formed and thus an image is displayed, and the non-display area NA is an area where an image is not displayed. The non-display area NA may surround the display area DA. The non-display area NA includes a pad portion 30 where a pad PAD that applies a driving signal to a pixel is formed.

In the display area DA, a plurality of pixels (not shown) including a transistor, a light emitting diode, and the like may be disposed. The plurality of pixels may be arranged in various formats, and for example, may be arranged in a matrix format. A touch area TA that includes a plurality of touch electrodes (refer to 520 and 540 of FIG. 2) to recognize a touch may be further provided in an upper portion of the display area DA.

In the non-display area NA, a driving voltage line (not shown), a driving low-voltage line (not shown), and the pad portion 30 may be disposed for transmission of a driving signal such as a voltage, a signal, and the like to the pixel formed in the display area DA. In addition, a plurality of detection wires (refer to 512 and 522 of FIG. 2) may be further disposed in the non-display area NA. The plurality of detection wires 512 and 522 may be connected to the plurality of touch electrodes 520 and 540. The plurality of detection wires 512 and 522 and the touch electrodes 520 and 540 will be described in detail with reference to FIG. 2.

The pad portion 30 is disposed in a portion of the non-display area NA, and includes a plurality of pads PAD. A voltage, a signal, and the like may be applied to the plurality of voltage lines (not shown), the plurality of detection wires 512 and 522 (refer to FIG. 2) through the plurality of pads PAD. A flexible printed circuit board (FPCB, not shown) may be attached to the non-display area NA. The FPCB may be electrically connected with the pad portion 30. The flexible printed circuit board FPCB and the pad portion 30 may be electrically connected by an anisotropic conductive film. The FPCB may include a driver integrated chip (IC, not shown), and a driving signal output from the driver IC may be supplied to each pixel through the plurality of pads PAD.

As shown in FIG. 2, the substrate 100 further includes a detection area TA where a plurality of touch electrodes 520 and 540 are formed and formed in an upper portion of the display area DA, and a peripheral area PA that surrounds the detection area TA. Depending on example embodiments, the detection area TA may include the display area DA and the non-display area DA of FIG. 1, and the peripheral area PA may include area excluding the detection area TA in the non-display area NA of FIG. 1. However, this is just an example, and the positions of the detection area TA and the peripheral area PA may be variously modified. For example, the detection area TA may include a part of the display area DA, and the peripheral area PA may include an area excluding the detection area TA in the display area DA and the non-display area NA. Alternatively, the detection area TA may include the display area DA and the non-display area NA.

The detection area TA may include a plurality of touch electrodes 520 and 540. The plurality of touch electrodes 520 and 540 may include a plurality of first touch electrodes 520 and a plurality of second touch electrodes 540.

The first touch electrode 520 and the second touch electrode 540 may be electrically separated from each other. Depending on example embodiments, the first touch electrode 520 may be a detection input electrode, and the second touch electrode 540 may be a detection output electrode. However, this is not restrictive, and the first touch electrode 520 may be a detection output electrode, and the second touch electrode 540 may be a detection input electrode.

The plurality of first touch electrodes 520 and the plurality of second touch electrodes 540 may be alternately distributed so as not to overlap each other in the detection area TA and may be arranged in a mesh form. The plurality of first touch electrodes 520 may be arranged in plural along a column direction (y-direction) and a row direction (x-direction), and the plurality of second touch electrodes 540 may be arranged in plural along the column and row directions. The plurality of first touch electrodes 520 may be connected in the column direction by a plurality of first touch electrode connection portions 521, and the plurality of second touch electrodes 540 may be connected in the row direction by second touch electrode connection portions 541.

The first touch electrode 520 and the second touch electrode 540 may be disposed in the same layer. Depending on example embodiments, the first touch electrode 520 and the second touch electrode 540 may be disposed on different layers. The first touch electrode 520 and the second touch electrode 540 may have a rhombus shape, but is not limited thereto. The first touch electrode 520 and the second touch electrode 540 may be polygonal such as quadrangle or hexagon, or circular or elliptical, and may be implemented in various shapes such as having a protruding portion to improve sensitivity of the detection sensor. The first touch electrode 520 and the second touch electrode 540 may be formed of transparent conductors or opaque conductors. For example, the first touch electrode 520 and the second touch electrode 540 may include a transparent conductive oxide (TCO), and the TCO may include at least one of indium-tin oxide (ITO), indium-zinc oxide (IZO), zinc oxide (ZnO), CNT (carbon nanotubes), and graphene. In addition, the first touch electrode 520 and the second touch electrode 540 may include a plurality of openings. The opening formed in the touch electrodes 520 and 540 serves to allow light emitted from the light emitting diode to be emitted to the front without interference.

The plurality of first touch electrodes 520 may be electrically connected to each other by a first touch electrode connection portions 521 (also called bridges), and the plurality of second touch electrodes 540 may be electrically connected to each other by a second touch electrode connection portions 541. When the plurality of first touch electrodes 520 are connected in a first direction, the plurality of second touch electrodes 540 may be connected in a second direction that crosses the first direction. When the first touch electrode 520 and the second touch electrode 540 are disposed in the same layer, one of the first touch electrode connection portion 521 and the second touch electrode connection portion 541 may be disposed on the same layer as the first touch electrode 520 and the second touch electrode 540, and the other may be disposed in a different layer from the first touch electrode 520 and the second touch electrode 540. Thus, the plurality of first touch electrodes 520 and the plurality of second touch electrodes 540 may be electrically separated from each other. A touch electrode connection portion disposed in a different layer may be disposed in an upper or lower layer of the first touch electrode 520 and the second touch electrode 540, and in an example embodiment, which will be described hereinafter, a touch electrode connection portion is disposed in a lower layer, which is a layer closer to the substrate.

In the peripheral area PA, a plurality of detection wires 512 and 522 that are respectively connected to the plurality of first touch electrodes 520 and the plurality of second touch electrodes 540 are disposed. The plurality of detection wires 512 and 522 may include a plurality of first detection wires 512 and a plurality of second detection wires 522. The first detection wires 512 may be connected with a plurality of second touch electrodes 540 arranged in a row direction, and the second detection wires 522 may be connected with the plurality of first touch electrode 520 arranged in a column direction. Depending on example embodiments, the first detection wire 512 and the second detection wire 522 may be electrically connected with a part of the pad PAD included in the pad portion 30 of FIG. 1.

In FIG. 2, a mutual-cap type of detection portion that detects a touch by using two touch electrodes 520 and 540 is illustrated. However, depending on example embodiments, a self-cap type of detection portion that detects a touch by using only one touch electrode may be formed.

Hereinafter, referring to FIG. 3, a display device according to an example embodiment will be described in detail with reference to a cross-sectional view of a display area DA.

Figure 3:
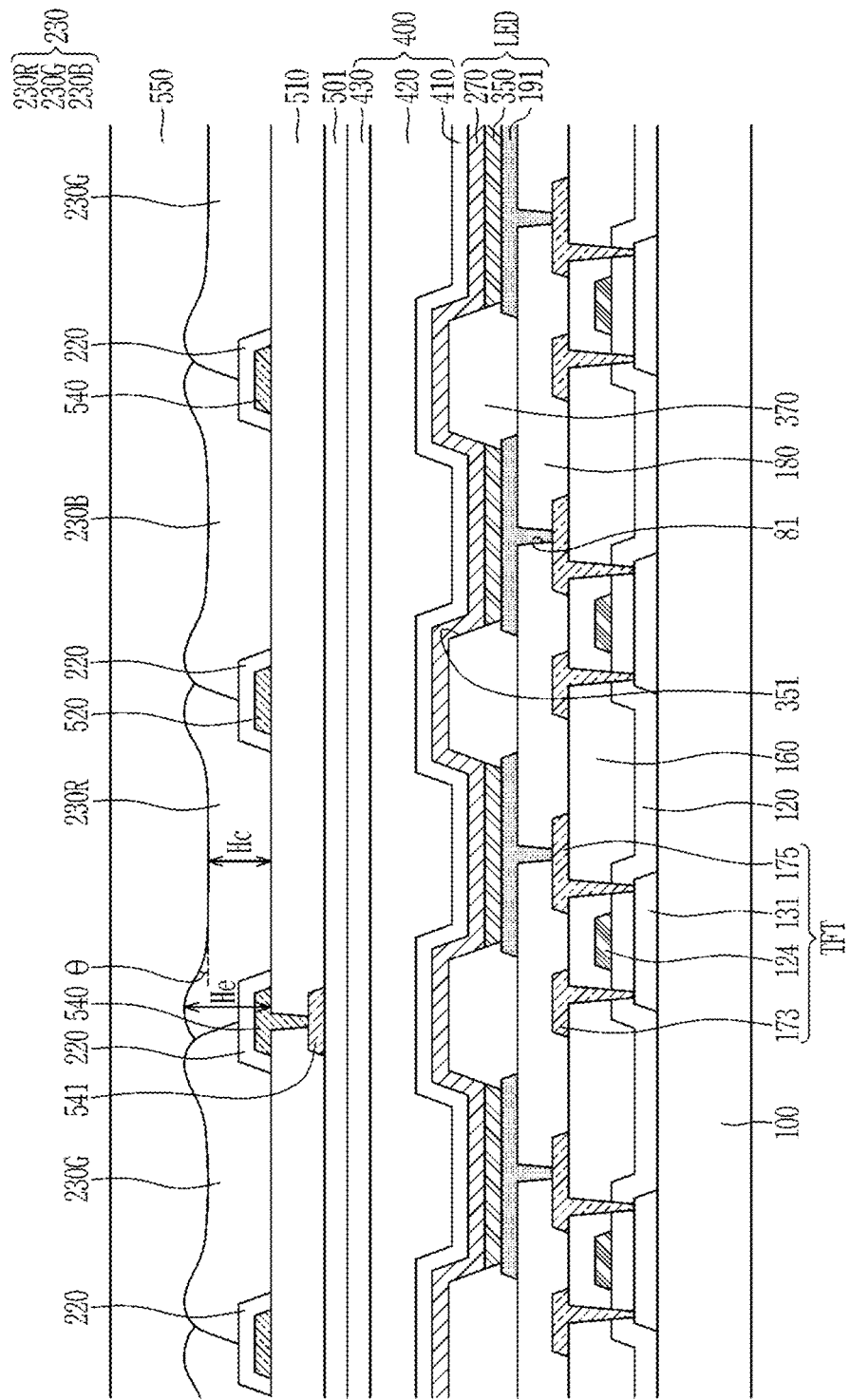
FIG. 3 is a cross-sectional view of a portion of a display area in a display device according to an example embodiment.

FIG. 3 is a cross-sectional view of a portion of a display area in a display device according to an example embodiment.

As shown in FIG. 3, a display area DA of a display device according to an example embodiment includes a substrate 100, a semiconductor 131, a gate electrode 124, a transistor TFT including a source electrode 173 and a drain electrode 175, a gate insulating layer 120, an interlayer insulating layer 160, a lower planarization layer 180, a pixel electrode 191, an emission layer 350, a barrier rib 370, a common electrode 270, and an encapsulation layer 400. Here, the pixel electrode 191, the emission layer 350, and the common electrode 270 may form a light emitting diode LED. In addition, the display device further includes a detection area TA that is disposed in an upper portion of the display area DA, and the detection area TA may include a detection insulation layer 510, a plurality of touch electrodes 520 and 540, and a touch electrode connection portion 541. In addition, the display device may further include a light blocking portion 220, a color filter layer 230, and a upper planarization layer 550 that are disposed in an upper portion of the detection area TA. The color filter layer 230 may include a red filter 230R, a green filter 230G, and a blue filter 230B.

The substrate 100 may include a material that does not bend because of a rigid characteristic such as glass, or may include a flexible material such as a plastic or a polyimide. Although it is not illustrated in FIG. 3, a lower buffer layer (not shown) or a barrier layer (not shown) may be further disposed on the substrate 100 to planarize the surface of the substrate 100 and block permeation of an impurity element. In this case, the barrier layer may be disposed on the substrate 100, and the buffer layer may be disposed on the barrier layer. The barrier layer may include an inorganic material, and for example, may include an inorganic insulating material such as a silicon nitride (SiNx), a silicon oxide (SiOx), a silicon oxynitride (SiOxNy), and the like. The barrier layer BA may be a single-layered or multi-layered structure of the material. The buffer layer may include an inorganic insulating material such as a silicon nitride (SiNx), a silicon oxide (SiOx), a silicon oxynitride (SiOxNy), and the like. The buffer layer may be a single layer of the material or a multi-layered structure.

The semiconductor 131 may be disposed on the substrate 100. The semiconductor 131 may include any one of amorphous silicon, polysilicon, and an oxide semiconductor. For example, the semiconductor 131 may include a low temperature polysilicon (LTPS) or a silicon oxide material including at least one of zinc (Zn), indium (In), gallium (Ga), tin (Sn), and a mixture thereof. For example, the semiconductor 131 may include indium-gallium-zinc oxide (IGZO). The semiconductor 131 may include a channel region, a source region, and a drain region, which are divided depending on whether or not being doped with an impurity. The source region and the drain region may have a conductive characteristic corresponding to a conductor.

The gate insulating layer 120 may cover the semiconductor 131 and the substrate 100. The gate insulating layer 120 may include an inorganic insulating material such as a silicon nitride (SiNx), a silicon oxide (SiOx), a silicon oxynitride (SiOxNy), and the like. The gate insulating layer 120 may be a single-layered or multi-layered structure of the material.

The gate electrode 124 may be disposed on the gate insulating layer 120. The gate electrode 124 may include a metal or a metal alloy or copper (Cu), molybdenum (Mo), aluminum (Al), silver (Ag), chromium (Cr), tantalum (Ta), titanium (Ti), and the like. The gate electrode 124 may be formed of a single layer or multiple layers. A region of the semiconductor 131, overlapping the gate electrode 124 on a plane may be a channel region.

The interlayer insulating layer 160 may cover the gate electrode 124 and the gate insulating layer 120. The interlayer insulating layer 160 may include an inorganic insulating material such as a silicon nitride (SiNx), a silicon oxide (SiOx), a silicon oxynitride (SiOxNy), and the like. The interlayer insulating layer 160 may be a single-layer or multi-layered structure of the material.

The source electrode 173 and the drain electrode 175 may be disposed on the interlayer insulating layer 160. The source electrode 173 and the drain electrode 175 are respectively connected to a source region and a drain region of the semiconductor by openings formed in the interlayer insulating layer 160 and the gate insulating layer 120. Accordingly, the semiconductor 131, the gate electrode 124, the source electrode 173, and the drain electrode 175 may form a single transistor TFT. Depending on example embodiments, the transistor TFT may include the source region and the drain region of the semiconductor 101 instead of including the source electrode 173 and the drain electrode 175.

The source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), and the like, or a metal alloy. The source electrode 173 and the drain electrode 175 may be formed of single or multiple layers. The source electrode 173 and the drain electrode 175 according to the example embodiment may be formed of a triple layer including an upper layer, a middle layer, and a lower layer, and the upper layer and the lower layer may include titanium (Ti) and the middle layer may include aluminum (Al).

The lower planarization layer 180 may be disposed on the source electrode 173 and the drain electrode 175. The lower planarization layer 180 covers the source electrode 173, the drain electrode 175, and the interlayer insulating layer 160. The lower planarization layer 180 is provided to planarize the surface of the substrate 100 where the transistor TFT is provided, and may be an organic insulating layer and may include one or more materials selected from a group consisting of polyimide, polyamide, acryl resin, benzocyclobutene, and phenol resin.

The pixel electrode 191 may be disposed on the lower planarization layer 180. The pixel electrode 191 is also called an anode, and may be formed of a single layer including a transparent conductive oxide film and a metallic material or multiple layers including them. The transparent conductive oxide layer may include indium tin oxide (ITO), poly-ITO, indium zinc oxide (IZO), indium gallium zinc oxide (IGZO), and indium tin zinc oxide (ITZO). The metallic material may include silver (Ag), molybdenum (Mo), copper (Cu), gold (Au), aluminum (Al), and the like.

A via hole 81 (also called an opening) is defined in the lower planarization layer 180 and exposes the drain electrode 175. The drain electrode 175 and the pixel electrode 191 may be physically and electrically connected to each other through the via hole 81 of the lower planarization layer 180. Accordingly, the pixel electrode 191 may receive an output current to be transmitted to the emission layer 350 from the drain electrode 175.

A barrier rib 370 may be disposed on the pixel electrode 191 and the lower planarization layer 180. The barrier rib 370 is also called a pixel defining layer (PDL), and includes a pixel opening 351 that exposes a part of the top surface of the pixel electrode 191. The barrier rib 370 may partition a position where the emission layer 350 is to be formed such that the emission layer 350 can be disposed in an exposed portion on the top surface of the pixel electrode. The barrier rib 370 may be an organic insulating layer that includes one or more materials selected from a group consisting of polyimide, polyamide, acryl resin, benzocyclobutene, and phenol resin.

Depending on example embodiments, the barrier rib 370 may be formed of a black pixel define layer BPDL including a black color pigment.

The emission layer 350 may be disposed in the pixel opening 351 partitioned by the barrier rib 370. The emission layer 350 may include organic materials that emit light of red, green, and blue. The emission layer 350 emitting red, green, and blue light may include a low molecular weight or high molecular weight organic material. In FIG. 3, the emission layer 350 is illustrated as a single layer, but an auxiliary layer such as an electron injection layer (EIL), an electron transport layer, a hole transport layer, and a hole injection layer (HIL) may be included above and below the emission layer 350, and in this case, the hole injection layer and the hole transport layer may be disposed below the emission layer 350 and the electron transport layer and the electron injection layer may be disposed above the emission layer 350.

The common electrode 270 may be disposed on the barrier rib 370 and the emission layer 350. The common electrode 270 is also called a cathode, and may be formed of a transparent conductive layer including indium tin oxide (ITO), indium zinc oxide (IZO), indium gallium zinc oxide (IGZO), and indium tin zinc oxide (ITZO). In addition, the common electrode 270 may have a semitransparent characteristic. In this case, a micro-cavity may be formed together with the pixel electrode 191. According to the micro-cavity structure, light with a specific wavelength is emitted upwards by the gap and characteristic between two electrodes, thereby displaying red, green, or blue.

The encapsulation layer 400 may be disposed on the common electrode 270. The encapsulation layer 400 may include at least one inorganic layer and at least one organic layer. In the present example embodiment, the encapsulation layer 400 may include a first inorganic encapsulation layer 410, an organic encapsulation layer 420, and a second inorganic encapsulation layer 430. However, this is only an example, and the number of inorganic and organic layers forming the encapsulation layer 400 may be variously changed. The first inorganic encapsulation layer 410, the organic encapsulation layer 420, and the second inorganic encapsulation layer 430 may be disposed in the display area DA and a part of the non-display area NA. Depending on example embodiments, the organic encapsulation layer 420 may be formed around the display area DA, and the first inorganic encapsulation layer 410 and the second inorganic encapsulation layer 430 may be formed up to the non-display area NA. The encapsulation layer 400 is to protect the light emitting diode LED from moisture or oxygen that may inflow from the outside, and the first inorganic encapsulation layer 410 and one end of the second inorganic encapsulation layer 430 may be formed to directly contact.

A buffer layer 501 may be disposed on the encapsulation layer 400. The buffer layer 501 may be formed as an inorganic insulating layer, and an inorganic material included in the inorganic insulating layer may be at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. Depending on example embodiments, the buffer layer 501 may be omitted.

A touch electrode connection portion 541, a detection insulation layer 510, and a plurality of touch electrodes 520 and 540 may be disposed on the buffer layer 501. One of the first touch electrode connection portion 521 and the second touch electrode connection portion 541 may be disposed in the same layer as the plurality of touch electrodes 520 and 540, and the other may be disposed in a different layer from the plurality of touch electrodes 520 and 540. Hereinafter, an example in which the second touch electrode connection portion 541 is disposed in a different layer from the plurality of touch electrodes 520 and 540 will be described.

The touch electrode connection portion 541, the detection insulation layer 510, and the plurality of touch electrodes 520 and 540 may form a detection sensor. The detection sensor may be classified into a resistive type, a capacitive type, an electro-magnetic type, and an optical type. The detection sensor according to the present example embodiment may be a capacitive type of sensor.

The touch electrode connection portion 541 may be disposed on the buffer layer 501, and the detection insulation layer 510 may be disposed on the buffer layer 501 and the second touch electrode connection portion 541. The detection insulation layer 510 may be an inorganic insulating layer, and depending on example embodiments, the detection insulation layer 510 may include an organic material. An inorganic material included in the inorganic insulation layer may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may include at least one of an acryl-based resin, a methacrylic resin, a polyisoprene, a vinyl resin, an epoxy resin, a urethane-based resin, a cellulose resin, and a perylene resin.

The plurality of touch electrodes 520 and 540 may be disposed on the detection insulation layer 510. The plurality of touch electrodes 520 and 540 may include a plurality of first touch electrodes 520 and a plurality of second touch electrodes 540. The first touch electrode 520 and the second touch electrode 540 may be electrically insulated from each other. The detection insulation layer 510 includes an opening that exposes the top surface of the second touch electrode connection portion 541, and the second touch electrode connection portion 541 is connected with the second touch electrode 540 through the opening of the detection insulation layer 540 such that two adjacent second touch electrodes 540 are electrically connected to each other. Meanwhile, the first touch electrode connection portion 521 that connects the first touch electrode 520 may be formed in the same layer as the first touch electrode 520 and the second touch electrode 540.

The plurality of touch electrodes 520 and 540 may have a conductive material having good conductivity. For example, the plurality of touch electrodes 520 and 540 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), and the like, or a metal alloy thereof. The plurality of touch electrodes 520 and 540 may be formed as a single layer or multiple layers. In this case, a plurality of openings may be formed in the plurality of touch electrodes 520 and 540 so that light emitted from the light emitting diode is emitted upward without interference. Depending on example embodiments, the plurality of touch electrodes 520 and 540 may be formed of a triple layer including an upper layer, a middle layer, and a lower layer, and the upper layer and the lower layer may include titanium (Ti), and the middle layer may include aluminum (Al).

A light blocking portion 220 may be disposed on the plurality of touch electrodes 520 and 540. The light blocking portion 220 may overlap the touch electrodes 520 and 540, while not overlapping the emission layer 350. Each of the light blocking portions 220 may overlap the entirety of each of the touch electrodes 520 and 540. Thus, the light blocking portion 220 may be formed to cover the top surfaces and the side surfaces of the touch electrodes 520 and 540. The light blocking portion 220 may include an organic material including a black color pigment, or a mixture of an organic material including a black color pigment and an inorganic material. As the touch electrodes 520 and 540 and the light blocking portion 220 are positioned so as to not overlap the emission layer 350, the emission layer 350 capable of displaying an image may not be disturbed by the touch electrodes 520 and 540 and the light blocking portion 220. The light blocking portion 220 may be formed to have a matrix shape. Thus, the light blocking portion 220 may be a black matrix.

A color filter layer 230 may be disposed on the detection insulation layer 510. The color filter layer 230 may overlap the emission layer 350. In addition, the color filter layer 230 may overlap the light blocking portion 220, and may overlap the touch electrodes 520 and 540. In this case, an edge of the color filter layer 230 may overlap the light blocking portion 220. The color filter layer 230 may include a red filter 230R, a green filter 230G, and a blue filter 230B. The red filter 230R may overlap an emission layer 350 of a light emitting diode that corresponds to a red pixel. That is, an emission layer 350 overlapping the red filter 230R may emit red light. The green filter 230G may overlap an emission layer 350 of a light emitting diode that corresponds to a green pixel. That is, an emission layer 350 overlapping the green filter 230G may emit green light. The blue filter 230B may overlap an emission layer 350 of a light emitting diode that corresponds to a blue pixel. That is, an emission layer 350 overlapping the blue filter 230B may emit blue light. The red filter 230R, the green filter 230G, and the blue filter 230B that form the color filter layer 230 may overlap each other at boundaries of pixels. The red filter 230R, the green filter 230G, and the blue filter 230B that form the color filter layer 230 may overlap the light blocking portion 220 at boundaries of pixels. For example, as depicted in FIG. 3, the light blocking portion 220, the red filter 230R, and the green filter 230G may overlap each other at a boundary between the red pixel and the green pixel. In addition, the light blocking portion 220, the green filter 230G, and the blue filter 230B may overlap at a boundary between the green pixel and the blue pixel. In addition, the light blocking portion 220, the blue filter 230B, and the red filter 230R may overlap each other at a boundary between the blue pixel and the red pixel.

In each of the red filter 230R, the green filter 230G, and the blue filter 230B that form the color filter layer 230, a height Hc of a center portion of each of the color filters, 230R, 230G, and 230B is lower than a height He of an edge portion of each of the color filters 230R, 230G, and 230B. That is, the central portion of the color filter layer 230 may have a similar height as a whole, and the height Hc may gradually increase from the central portion to the edge portion. Thus, the top surface of the color filter layer 230 may have an inclined surface at the boundaries of the edge portions. In particular, an angle θ formed by an extension line of the center portion of the color filter layer 230 and the inclined surface may be between about 1 degree or more and about 15 degrees or less. However, the shape of the color filter 230 illustrated in FIG. 3 is just an example, and may be variously modified. The center portion of the color filter layer 230 may be disposed directly above the detection insulation layer 510. The edge portion of the color filter layer 230 may overlap the light blocking portion 220. In addition, the edge portion of the color filter layer 230 may overlap an edge portion of another adjacent color filter layer 230. That is, two different color filter layers 230 that are adjacent to each other may overlap on the light blocking portion 220.

Since the display device according to the example embodiment includes the light blocking portion 220 and the color filter layer 230, a polarizer may be omitted. As described, manufacturing cost can be reduced and the thickness of the display device can be reduced by not using a polarizer.

Depending on example embodiments, the color filter layer 230 that includes the red filter 230R, the green filter 230G, and the blue filter 230B may be replaced with a color conversion layer, or may further include a color conversion layer. The color conversion layer may include quantum dots.

A upper planarization layer 550 may be disposed on the color filter layer 230 and the light blocking portion 220. The upper planarization layer 550 may be disposed directly above the color filter layer 230. That is, the upper planarization layer 550 may contact the color filter layer 230. In this case, the bottom surface of the upper planarization layer 550 may contact the top surface of the color filter layer 230. The upper planarization layer 550 may include a light-transmitting organic material having a high refractive index. The upper planarization layer 550 may have a relatively higher refractive index than the color filter layer 230. The refractive index of the color filter layer 230 may be between about 1.5 or more and about 1.7 or less. The refractive index of the upper planarization layer 550 may be between about 1.65 or more and about 2.0 or less. For example, the refractive index of the red filter 230R may be about 1.62, the refractive index of the green filter 230G may be about 1.57, and the refractive index of the blue filter 230B may be about 1.54. In this case, the refractive index of the upper planarization layer 550 may be about 1.7 to about 1.75. However, this is just an example, and the refractive index of each of the red filter 230R, the green filter 230G, the blue filter 230B, and the upper planarization layer 550 can be variously changed within the above-stated numerical range.

The upper planarization layer 550 may planarize the top surface of the display device, and may be formed of an organic insulation layer. The organic insulation layer may include a material selected from a group consisting of polyimide, polyamide, acryl resin, benzocyclobutene, and phenol resin. An organic insulating material has many merits such as excellent impact resistance and process stability compared to inorganic insulating materials, but may have a relatively low refractive index. Thus, in the display device according to the example embodiment, an organic insulation layer is used to secure a high refractive index of the upper planarization layer 550, while including a nano-composite therein. A refractive index of a general organic insulation layer may be about 1.3 to about 1.7. The upper planarization layer 550 in the example embodiment may include a nano-composite of an inorganic material such as $TiO_2$, $Al_2O_3$, $SiO_2$, $Al_2TiO_3$, $ZrO_2$, PbS, ZnS, and the like. The upper planarization layer 550 according to the example embodiment includes the nano-composite together with the organic insulating material, and thus the refractive index of the upper planarization layer 550 may be increased up to about 1.65 to about 2.0.

Hereinafter a refractive index according to a content of the nano-composite included in the upper planarization layer of the display device according to the example embodiment will be described.

Figure 4:
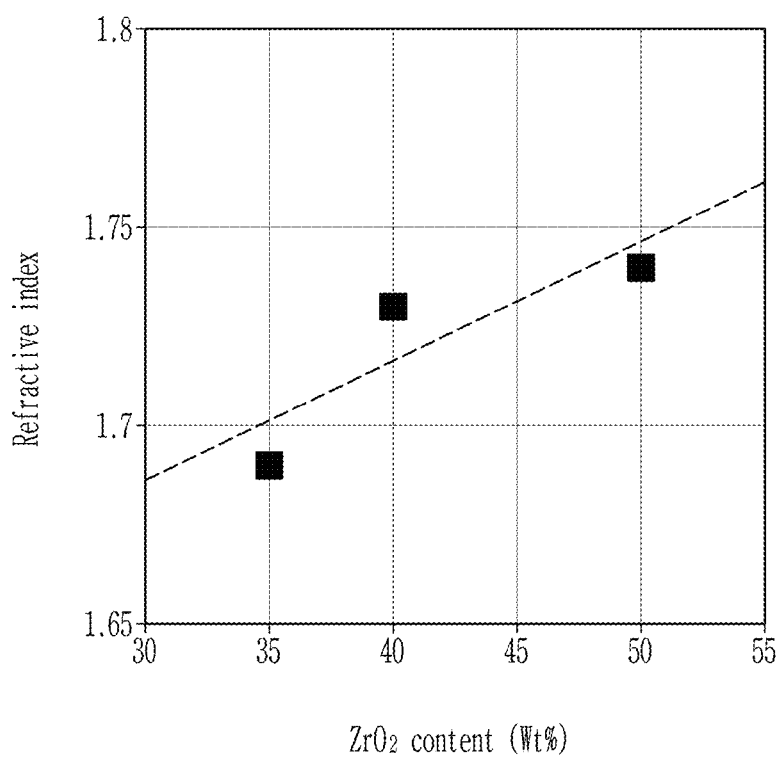
FIG. 4 is a graph that illustrates a refractive index according to a content of the nano-composite of the upper planarization layer of the display device according to the example embodiment.

FIG. 4 is a graph that illustrates a refractive index according to a content of the nano-composite of the upper planarization layer of the display device according to the example embodiment. FIG. 4 shows a case that the upper planarization layer includes acryl resin and $ZrO_2$.

As shown in FIG. 4, it can be determined that the refractive index of the upper planarization layer increases as the content of the nano-composite such as $ZrO_2$ contained in the upper planarization layer containing organic material such as acryl resin increases. The refractive index of the organic insulation layer may be increased by adding a nano-composite of an inorganic material such as $TiO_2$, $Al_2O_3$, $SiO_2$, $Al_2TiO_3$, $ZrO_2$, PbS, ZnS, and the like to the organic insulation layer. In this case, the refractive index of the upper planarization layer can be improved by increasing the content of the nano-composite.

Although it is not illustrated, a cover window that protects the display device may be further disposed on the upper planarization layer 550. An adhesive layer may be further disposed between the upper planarization layer 550 and the cover window.

In the display device according to the example embodiment, the red filter 230R, the green filter 230G, and the blue filter 230B that form the color filter layer 230 each has the shape in which the height of the center portion is lower than the height of the edge portion, and the upper planarization layer 550 having a higher refractive index than the color filter layer 230 is disposed on the color filter layer 230 such that the front visibility and light emission efficiency of the display device can be improved. Hereinafter, a light path of the display device according to the example embodiment will be described with reference to FIGS. 5A, 5B, and 5C.

Figure 5A:
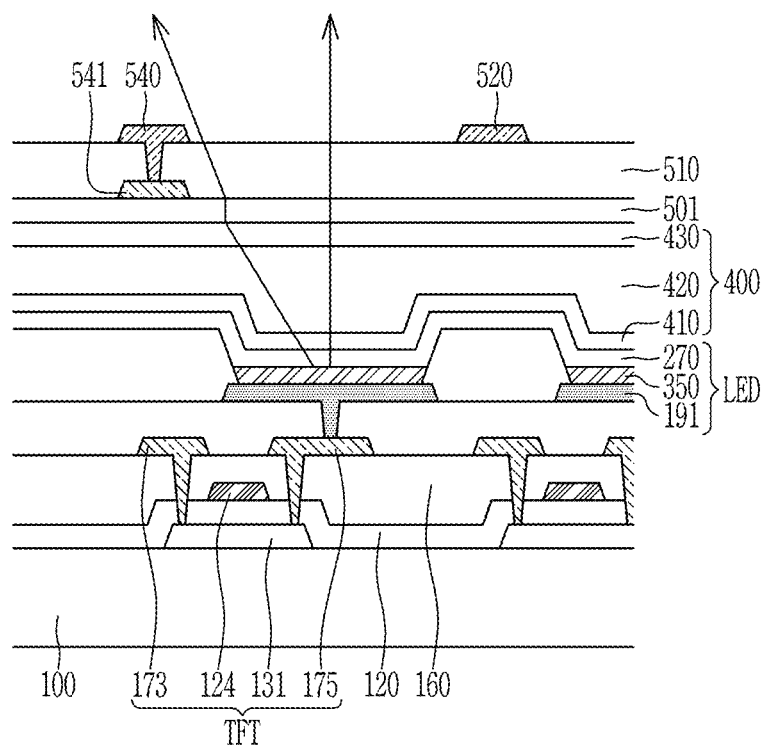
FIG. 5A and FIG. 5B are cross-sectional views of a light path in display devices according to comparative examples.
Figure 5B:
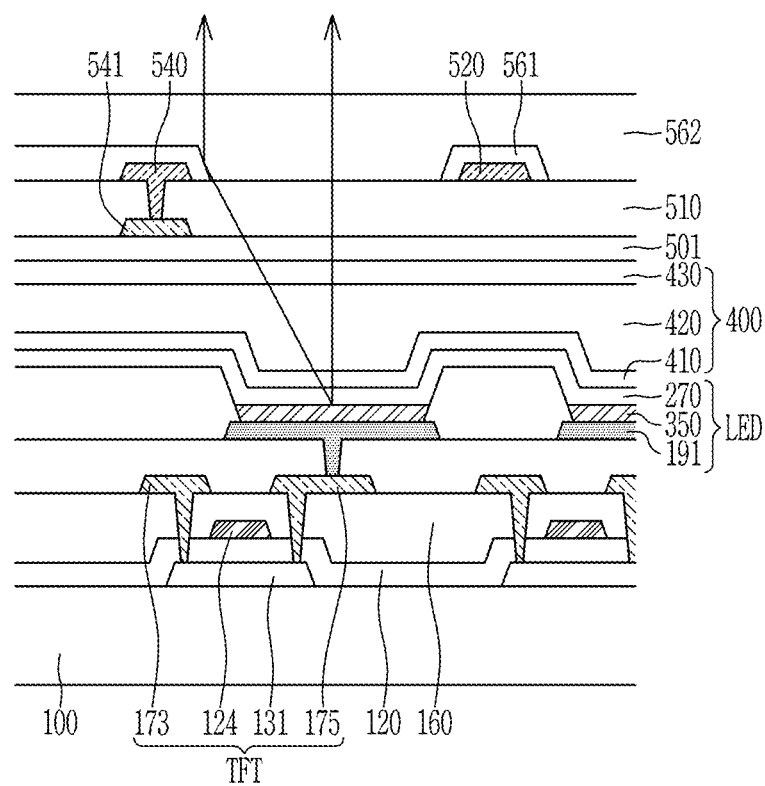
Figure 5C:
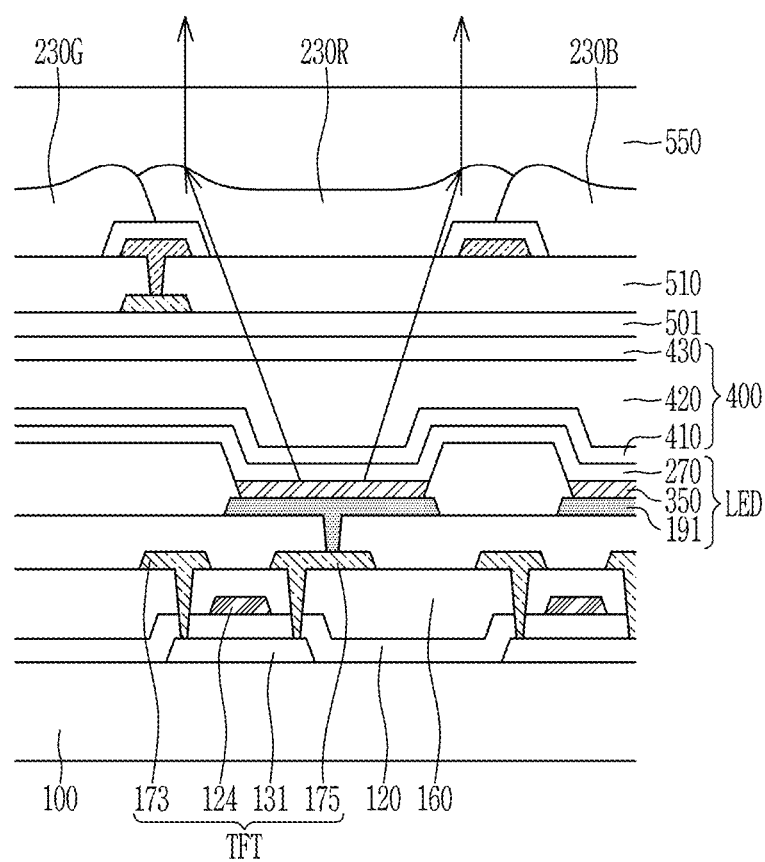
FIG. 5C is a cross-sectional view of a light path in the display device according to the example embodiment.

FIG. 5A and FIG. 5B are cross-sectional views of a light path in display devices according to comparative examples, and FIG. 5C is a cross-sectional view of a light path in the display device according to the example embodiment.

Most of the light generated from the emission layer 350 passes through the center of each pixel and can be emitted toward the front. For example, red light generated from the emission layer 350 may be emitted toward the front of a red pixel. In addition, green light generated from the emission layer 350 may be emitted toward the front of a green pixel. Further, blue light generated from the emission layer 350 may be emitted toward the front of a blue pixel. However, some of the light generated from emission layer 350 may be incident on the edge of each pixel. As shown in FIG. 5A, in the display device according to the comparative example, light generated from the emission layer 350 and passed through an edge of each pixel may not be emitted toward the front of each pixel. The display device according to the comparative example does not include the color filter layer 230 and the upper planarization layer 550 of the display device according to the example embodiment. In the display device according to the comparative example, although it is not illustrated, light passed through the edge of each pixel may be emitted to a side, may be emitted to another adjacent pixel, or may be reflected on another layer and incident back into the display device. As shown in FIG. 5B, a display device according to another comparative example may include a low refractive index layer 561 and a high refractive index layer 562. The low refractive index layer 561 may be disposed on the touch electrodes 520 and 540 to overlap the touch electrodes 520 and 540. The high refractive index layer 562 may be disposed on the low refractive index layer 561. The high refractive index layer 562 may be disposed on the entire substrate 100. In this case, light passed through an edge of each pixel is totally reflected at an interface of the low refractive index layer 561 and the high refractive index layer 562, and thus light can be condensed to the front.

As shown in FIG. 5C, in the display device according to the example embodiment, when light generated from the emission layer 350 and incident on the edge of the color filter layer 230 passes through the interface between the color filter layer 230 and the upper planarization layer 550, a light path is changed such the light can be emitted toward the front of each pixel. As the light path of the light emitted from the emission layer 350 and passed through the edge of each pixel is changed at the interface between the color filter layer 230 having a relatively low refractive index and the upper planarization layer 550 having a relatively low refractive index such that the light can be condensed in front. That is, the display device according to the example embodiment can increase the front light emission efficiency while omitting the use of the polarizer with a principle similar to the principle shown in FIG. 5B.

Hereinafter, a color filter layer of the display device according to the example embodiment will be described in detail with reference to FIGS. 6A, 6B, 7, 8, 9, 10, 11, and 12.

Figure 6A:
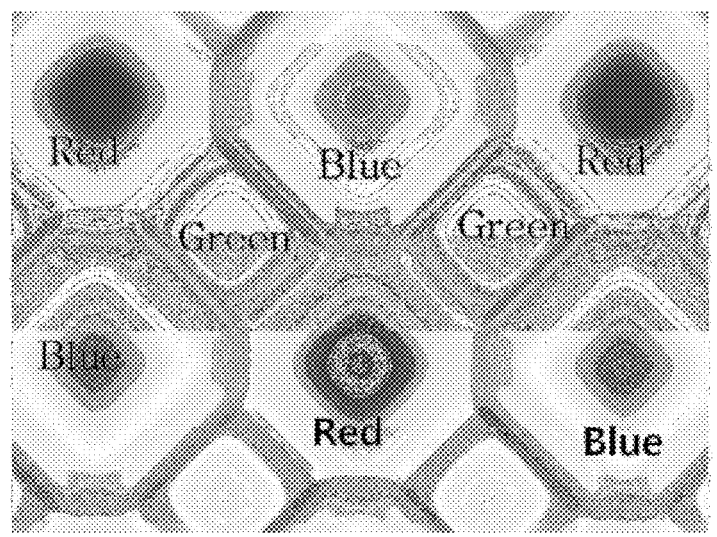
FIG. 6A shows the top surface of the color filter layer of the display device according to the example embodiment, measured with a 3D profile.
Figure 6B:
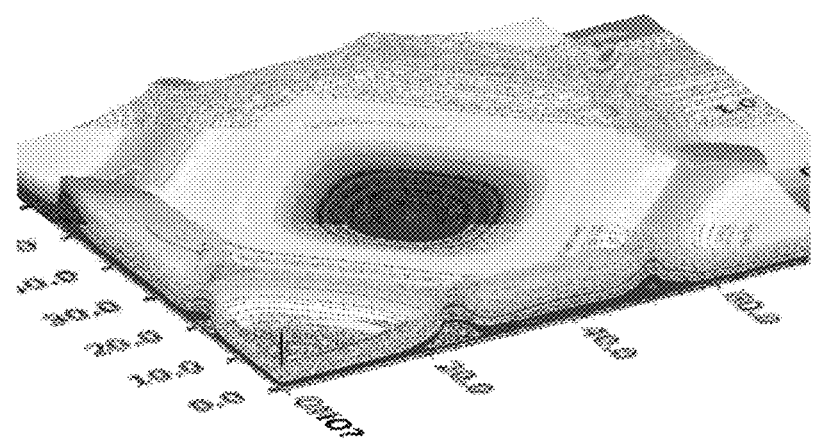
FIG. 6B shows a top surface of a color filter layer of a pixel of the display device according to the example embodiment, measured with a 3D profile.
Figure 7:
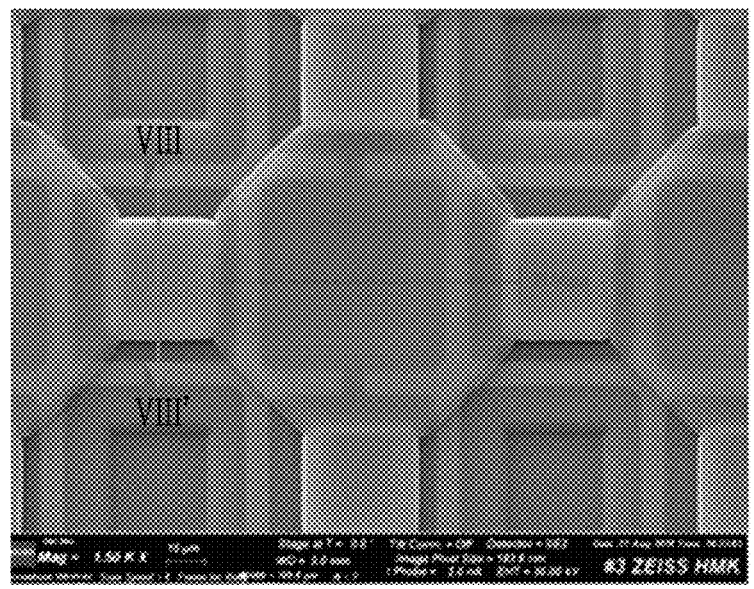
FIG. 7 shows a part of the display device according to the example embodiment.
Figure 8:
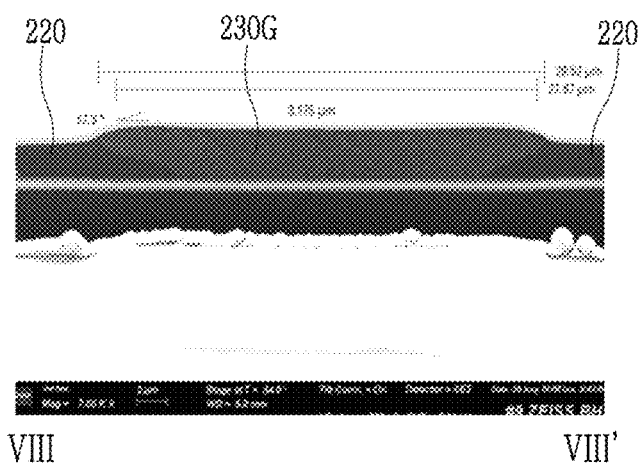
FIG. 8 is a cross-sectional view of FIG. 7, taken along line VIII-VIII.
Figure 9:
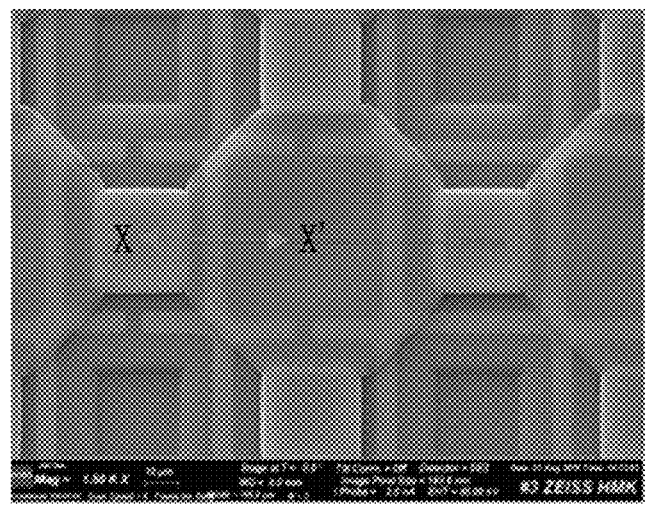
FIG. 9 shows a part of the display device according to the example embodiment.
Figure 10:
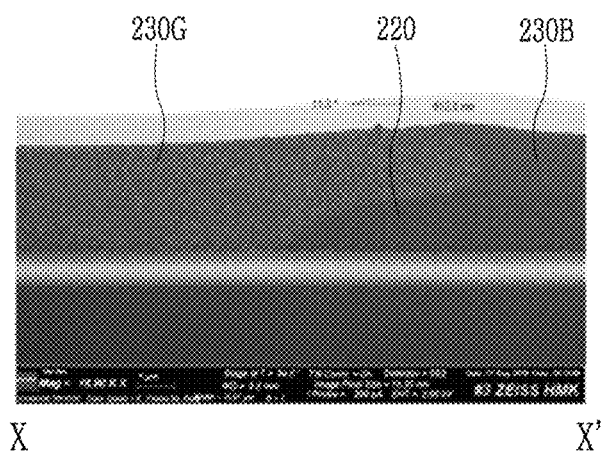
FIG. 10 is a cross-sectional view of FIG. 9, taken along line X-X.
Figure 11:
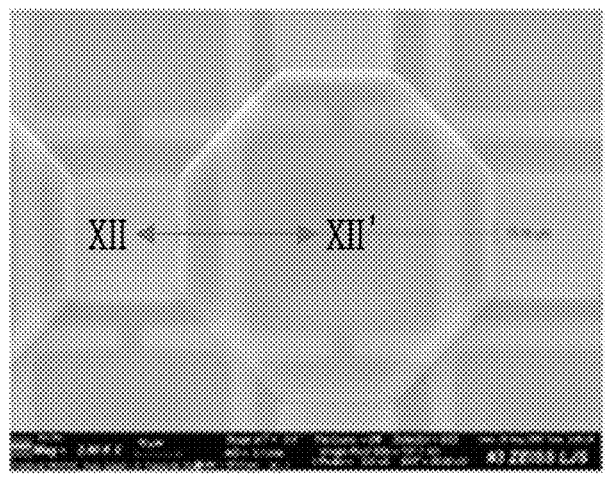
FIG. 11 shows a part of the display device according to the example embodiment.
Figure 12:
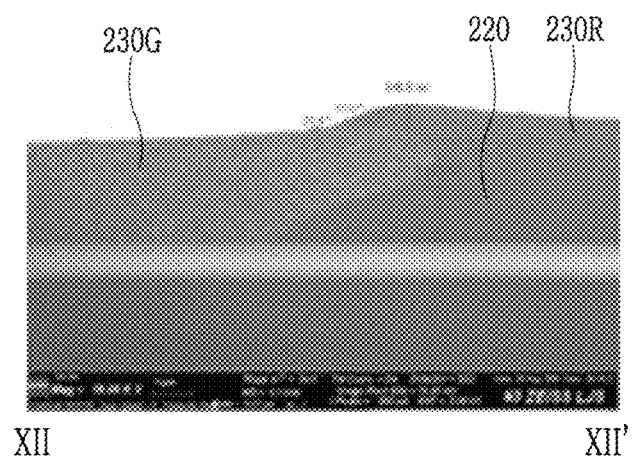
FIG. 12 is a cross-sectional view of FIG. 11, taken along line XII-XII.

FIG. 6A shows the top surface of the color filter layer of the display device according to the example embodiment, measured with a 3D profile, and FIG. 6B shows a top surface of a color filter layer of a pixel of the display device according to the example embodiment, measured with a 3D profile. FIG. 7 shows a part of the display device according to the example embodiment, and FIG. 8 is a cross-sectional view of FIG. 7, taken along line VIII-VIII. FIG. 9 shows a part of the display device according to the example embodiment, and FIG. 10 is a cross-sectional view of FIG. 9, taken along line X-X. FIG. 11 shows a part of the display device according to the example embodiment, and FIG. 12 is a cross-sectional view of FIG. 11, taken along line XII-XII.

As shown in FIG. 6A and FIG. 6B, the top surface of the color filter layer of the display device according to the example embodiment is not flat, and may have different heights depending on positions. The display device according to the example embodiment may include a plurality of pixels Red, Green, and Blue. The plurality of pixels Red, Green, and Blue may include a red pixel Red, a green pixel Green, and a blue pixel Blue. A blue pixel Blue may be disposed between adjacent red pixels Red in a horizontal direction or a vertical direction. A green pixel Green may be disposed between adjacent red pixels Red in a diagonal direction. A green pixel Green may be disposed between adjacent blue pixels Blue in a diagonal direction. The red pixel Red, the green pixel Green, and the blue pixel Blue may be different from each other in size. For example, the size of the blue pixel Blue may be similar to the size of the red pixel Red, and the size of the green pixel Green may be smaller than the size of the blue pixel Blue and may be smaller than the red pixel Red. A height of a color filter layer at a center of each of the pixels Red, Green, and Blue may be relatively low, and a height of a color filter layer at an interface between the respective pixels Red, Green, and Blue may be relatively high. That is, the color filter layer at the edge of each pixel Red, Green, and Blue may have a relatively high height. The color filter layer at the center of each of the pixels Red, Green, and Blue may have a constant height, and the height of the color filter layer may gradually increase from the center to the edge.

As shown in FIG. 7 and FIG. 8, the light blocking portion 220 is formed first, and then the green filter 230G may be formed later. In this case, a center portion of the green filter 230G does not overlap the light blocking portion 220, and an edge portion of the green filter 230G may overlap the light blocking portion 220. The center portion of the green filter 230G, not overlapping the light blocking portion 220 may have a constant height, while having a relatively low height. The edge portion of the green filter 230G overlapping the light blocking portion 220 may have a relatively high height, and the height may be gradually increased away from the center portion of the green filter 230G and then lowered again at the end of the green filter 230G. That is, the edge portion of the green filter 230G may have a relatively high height compared to the center as it overlaps the light blocking portion 220.

As shown in FIG. 9 and FIG. 10, after forming the light blocking portion 220 and the green filter 230G, the blue filter 230B may be formed. In this case, an edge of the blue filter 230B may overlap the light blocking portion 220, and may overlap the green filter 230G. That is, the green filter 230G may be disposed on the light blocking portion 220, and then the blue filter 230B may be disposed on the green filter 230G. A center portion of the blue filter 230B may not overlap the light blocking portion 220 and the green filter 230G. The center portion of the blue filter 230B, not overlapping the light blocking portion 220 and the green filter 230G, may have a constant height, but lower than the edge portion of the blue filter 230B. The edge portion of the blue filter 230B, overlapping the light blocking portion 220 and the green filter 230G, may have a higher height than the center portion of the blue filter 230B, and the height may be gradually increased away from the center portion of the blue filter 230B and then lowered again at the end of the blue filter 230B. That is, as the edge portion of the blue filter 230B overlaps the light blocking portion 220 and the green filter 230G, the height may be relatively high compared to the center.

As shown in FIG. 11 and FIG. 12, after forming the light blocking portion 220, the green filter 230G, the blue filter 230B, and the red filter 230R may be formed. In this case, an edge portion of the red filter 230R may overlap the light blocking portion 220, and may overlap the green filter 230G. That is, the green filter 230G may be disposed on the light blocking portion 220, and the red filter 230R may be disposed on the green filter 230G. A center portion of the red filter 230R may not overlap the light blocking portion 220 and the green filter 230G. The center portion of the red filter 230R, not overlapping the light blocking portion 220 and the green filter 230G, may have a lower height than the edge portion of the red filter 230R, and may have a constant height. The edge portion of the red filter 230R, overlapping the light blocking portion 220 and the green filter 230G may have a higher height than the center portion of the red filter 230R, and the height may be gradually increased away from the center portion of the red filter 230R and then lowered again at the end of the red filter 230R. That is, as the edge portion of the red filter 230R overlaps the light blocking portion 220 and the green filter 230G, the height of the edge portion may be relatively high compared to the center portion.

As described above, the center of the color filter layer 230 may be formed to have a concave shape by using the overlapping relationship between the color filter layer 230 and the light blocking portion 220. That is, the center portion of the color filter layer 230 may have a relatively low height, and the edge portion may have a relatively high height. Various other methods may be used to form the shape of the color filter layer 230. As the height difference between the center portion and the edge portion of the color filter layer 230 increases, it can be advantageous to increase the front light emission rate. Accordingly, a halftone mask or the like may be used to form a larger height difference between the center and the edge of the color filter layer 230. By using a halftone mask to make the thickness of the edge portion of the color filter layer 230 thicker than the thickness of the center portion, the center portion of the color filter layer 230 may be formed to have a concave shape.

In the display device according to the example embodiment of FIG. 3, one transistor is illustrated in each pixel, but this is not restrictive, and each pixel of a display device according to an example embodiment may include a plurality of transistors. Hereinafter, a connection relationship between a plurality of transistors included in one pixel and wires of a display device according to an example embodiment will be described with reference to FIG. 13.

Figure 13:
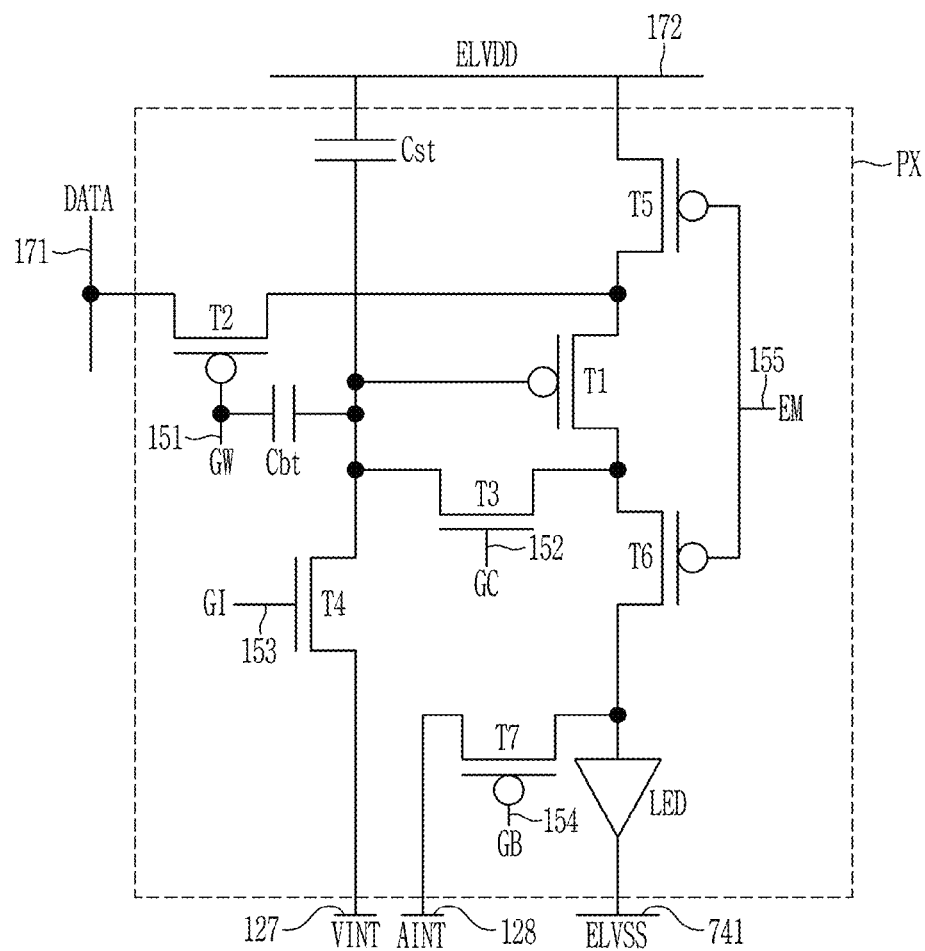
FIG. 13 is a circuit diagram of a display device according to an example embodiment.

FIG. 13 is a circuit diagram of a display device according to an example embodiment.

As shown in FIG. 13, a single pixel of a display device according to an example embodiment includes a plurality of transistors T1, T2, T3, T4, T5, T6, and T7 connected to a plurality of wires 127, 128, 151, 152, 153, 154, 155, 171, 172, and 741, a storage capacitor Cst, a boost capacitor Cbt, and a light emitting diode LED.

The plurality of wires 127, 128, 151, 152, 153, 154, 155, 171, 172, and 741 are connected to a single pixel PX. The plurality of wires include a first initialization voltage line 127, a second initialization voltage line 128, a first scan line 151, a second scan line 152, an initialization control line 153, a bypass control line 154, a light emission control line 155, a data line 171, a driving voltage line 172, and a common voltage line 741.

The first scan line 151 is connected to a gate driver (not shown) and transmits a first scan signal GW to the second transistor T2. The second scan line 152 may be applied with a voltage of which polarity is opposite to polarity of a voltage applied to the first scan line 151 at the same timing as the signal of the first scan line 151. For example, when a negative voltage is applied to the first scan line 151, a positive voltage may be applied to the second scan line 152. The second scan line 152 transmits a second scan signal GC to a third transistor T3.

The initialization control line 153 transmits an initialization control signal GI to a fourth transistor T4. The bypass control line 154 transmits a bypass signal GB to a seventh transistor T7. The bypass control line 154 may be formed of a first scan line 151 of a previous stage.

The light emission control line 155 transmits a light emission control signal EM to a fifth transistor T5 and a sixth transistor T6.

The data line 171 is a wire that transmits a data voltage DATA generated in a data driver (not shown), and luminance of the light emitting diode LED changes depending on the data voltage DATA applied to the pixel PX.

The driving voltage line 172 applies a driving voltage ELVDD. The first initialization voltage line 127 transmits a first initialization voltage VINT, and the second initialization voltage line 128 transmits a second initialization voltage AINT. The common voltage line 741 applies a common voltage ELVSS to a cathode of the light emitting diode LED. In the present example embodiment, the driving voltage line 172, the first and second initialization voltage lines 127 and 128, and the common voltage line 741 may be applied with constant voltages, respectively.

Hereinafter, a structure and a connection relationship of a plurality of transistors will be described in detail.

The driving transistor T1 may have a P-type transistor characteristic, and may include a polycrystalline semiconductor. The driving transistor T1 is a transistor that adjusts intensity of a current output to an anode of the light emitting diode LED according to the data voltage DATA applied to a gate of the driving transistor T1. Since brightness of the light emitting diode LED is controlled according to the intensity of the current output to the anode of the light emitting diode LE, luminance of the light emitting diode LED can be controlled according to the data voltage DATA applied to the pixel PX. For this purpose, a first electrode of the driving transistor T1 is disposed to be able to receive the driving voltage ELVDD, and thus is connected with the driving voltage line 172 via a fifth transistor T5. In addition, the first electrode of the driving transistor T1 is also connected with a second electrode of the second transistor T2 and thus receives the data voltage DATA. Meanwhile, the second electrode of the driving transistor T1 is disposed to output a current toward the light emitting diode LED, and thus is connected with the anode of the light emitting diode LED via a sixth transistor T6. In addition, the second electrode of the driving transistor T1 transmits the data voltage DATA applied to the first electrode to a third transistor T3. The gate electrode of the driving transistor T1 is connected with one electrode (hereinafter, referred to as a second storage electrode) of the storage capacitor Cst. Thus, a voltage of the gate electrode of the driving transistor T1 is changed according to a voltage stored in the storage capacitor Cst, and accordingly, a driving current output from the driving transistor T1 is changed. In addition, the storage capacitor Cst also serves to maintain the voltage of the gate electrode of the driving transistor T1 constant for one frame.

A second transistor T2 may have a P-type transistor characteristic, and may include a polycrystalline semiconductor. The second transistor T2 is a transistor that receives the data voltage DATA into the pixel PX. A gate electrode of the second transistor T2 is connected with the first scan line 151 and one electrode (hereinafter, referred to as a first boost electrode) of the boost capacitor Cbt. A first electrode of the second transistor T2 is connected with the data line 171. A second electrode of the second transistor T2 is connected with the first electrode of the driving transistor T1. When the second transistor T2 is turned on by a negative voltage of the first scan signal GW transmitted through the first scan line 151, the data voltage DATA transmitted through the data line 171 is transmitted to the first electrode of the driving transistor T1.

A third transistor T3 may have an N-type transistor characteristic, and may include an oxide semiconductor. The third transistor T3 electrically connects the second electrode of the driving transistor T1 and the gate electrode of the driving transistor T1. Thus, a compensation voltage changed from the data voltage DATA through the driving transistor T1 is transmitted to a second storage electrode of the storage capacitor Cst by the third transistor T3. The gate electrode of the third transistor T3 is connected with the second scan line 152, and a first electrode of the third transistor T3 is connected with the second electrode of the driving transistor T1. The second electrode of the third transistor T3 is connected with the second storage electrode of the storage capacitor Cst, the gate electrode of the driving transistor T1, and the other electrode (hereinafter, referred to as a second boost electrode) of the boost capacitor Cbt. The third transistor T3 is turned on by a positive voltage of the second scan signal GC transmitted through the second scan line 152, and thus connects the gate electrode of the driving transistor T1 and the second electrode of the driving transistor T1, and transmits the voltage applied to the gate electrode of the driving transistor T1 to the second storage electrode of the storage capacitor Cst such that the transmitted voltage is stored in the storage capacitor Cst.

A fourth transistor T4 may have an N-type transistor characteristic, and may include an oxide semiconductor. The fourth transistor T4 serves to initialize the gate electrode of the driving transistor T1 and the second storage electrode of the storage capacitor Cst. A gate electrode of the fourth transistor T4 is connected with the initialization control line 153, and a first electrode of the fourth transistor T4 is connected with the first initialization voltage line 127. A second electrode of the fourth transistor T4 is connected with the second storage electrode of the storage capacitor Cst, the gate electrode of the driving transistor T1, and the second boost electrode via the second electrode of the third transistor T3. The fourth transistor T4 is turned on by a positive voltage of the initialization control signal GI transmitted through the initialization control line 153, and in this case, transmits the first initialization voltage VINT to the gate electrode of the driving transistor T1 and the second storage electrode of the storage capacitor Cst. Accordingly, the voltage of the gate electrode of the driving transistor T1, and the storage capacitor Cst are initialized.

A fifth transistor T5 may have a P-type transistor characteristic, and may include a polycrystalline semiconductor. The fifth transistor T5 serves to transmit the driving voltage ELVDD to the driving transistor T1. A gate electrode of the fifth transistor T5 is connected with the light emission control line 155, a first electrode of the fifth transistor T5 is connected with the driving voltage line 172, and a second electrode of the fifth transistor T5 is connected with the first electrode of the driving transistor T1.

A sixth transistor T6 may have a P-type transistor characteristic, and may include a polycrystalline semiconductor. The sixth transistor T6 serves to transmit a driving current output from the driving transistor T1 to the light emitting diode LED. A gate electrode of the sixth transistor T6 is connected with the light emission control line 155, and a first electrode of the sixth transistor T6 is connected with the second electrode of the driving transistor T1 and a second electrode of the sixth transistor T6 is connected with the anode of the light emitting diode LED.

A seventh transistor T7 may have a P-type transistor characteristic, and may include a polycrystalline semiconductor. The seventh transistor T7 serves to initialize the anode of the light emitting diode LED. A gate electrode of the seventh transistor T7 is connected with the bypass control line 154, and a first electrode of the seventh transistor T7 is connected with the anode of the light emitting diode LED and a second electrode of the seventh transistor T7 is connected with the second initialization voltage line 128. When the seventh transistor T7 is turned on by a negative voltage of the bypass signal GB, the second initialization voltage AINT is applied to the anode of the light emitting diode LED and thus the anode is initialized.

In the above description, one pixel includes seven transistors T1, T2, T3, T4, T5, T6, and T7, one storage capacitor Cst, and one boost capacitor Cbt, but this is not restrictive, and the number of transistors, the number of capacitors, and connection relationships between the transistors and the capacitors can be variously modified.

In the above description, the driving transistor T1, the second transistor T2, the fifth transistor T5, the sixth transistor T6, and the seventh transistor T7 may have the P-type transistor characteristic, and the third transistor T3 and the fourth transistor T4 have the N-type transistor characteristic, but this is not restrictive, and a characteristic of each transistor can be variously modified. For example, the driving transistor T1, the second transistor T2, the third transistor T3, the fourth transistor T4, the fifth transistor T5, the sixth transistor T6, and the seventh transistor T7 all may have the P-type transistor characteristic.

In the present example embodiment, the driving transistor T1 may include a polycrystalline semiconductor. In addition, the third transistor T3 and the fourth transistor T4 may include an oxide semiconductor. The second transistor T2, the fifth transistor T5, the sixth transistor T6, and the seventh transistor T7 may include a polycrystalline semiconductor. However, this is not restrictive, and at least one or more of the second transistor T2, the fifth transistor T5, the sixth transistor T6, and the seventh transistor T7 may include an oxide semiconductor. In addition, all the transistors may include a polycrystalline semiconductor. In the present example embodiment, the third transistor T3 and the fourth transistor T4 include a different semiconductor material from that of the driving transistor T1, and thus it is possible to drive more stably and improve reliability.

As previously described, when a positive voltage is applied to the first scan line 151, a negative voltage is applied to the second scan line 152, and when a negative voltage is applied to the first scan line 151, the positive voltage is applied to the second scan line 152. That is, since the second scan signal GC applied to the second scan line 152 is formed of the first scan signal GW applied to the first scan line 151 and the inverted signal, the gate voltage of the driving transistor T1 is lowered after writing data. On the contrary, the first scan signal GW raises the gate voltage of the driving transistor T1. Therefore, when a black voltage is written, a black voltage may decrease. In the present example embodiment, the boost capacitor Cbt is disposed between the first scan line 151 to which the first scan signal GW is applied and the gate electrode of the driving transistor T1 such that turning-on of the driving transistor T1 is smoothly carried out when the second transistor T2 is turned on, thereby effectively transmitting the data voltage DATA to the third transistor T3. Accordingly, the black voltage can be stably output. As capacity of the boost capacitor Cbt is increased, the gate voltage of the driving transistor T1 can be more increased. Thus the gate voltage of the driving transistor T1 can be controlled by adjusting capacity of the boost capacitor Cbt.

Next, referring to FIG. 14, a display device according to an example embodiment will be described.

Figure 14:
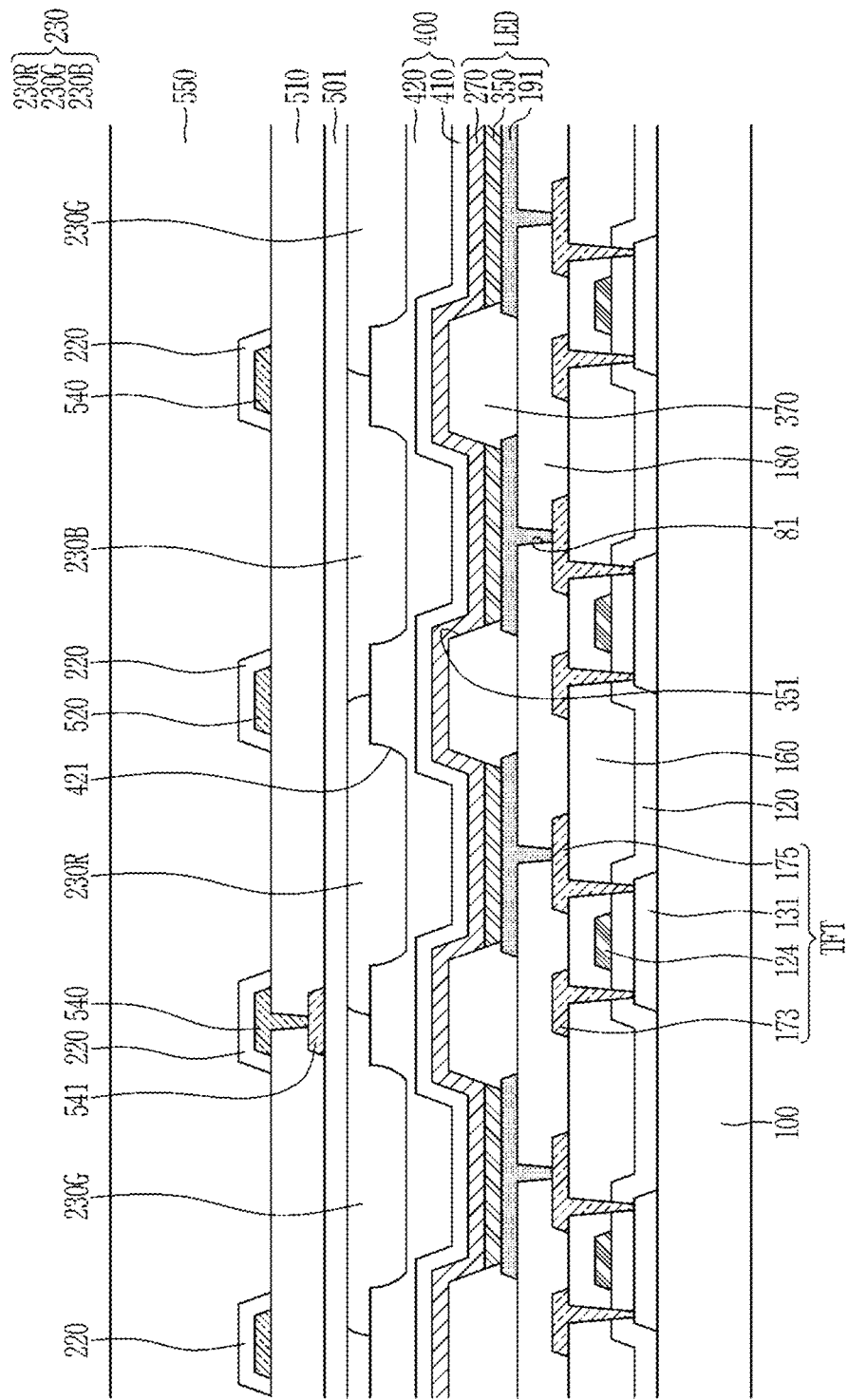
FIG. 14 is a cross-sectional view of a display device according to an example embodiment.

A display device according to an example embodiment shown in FIG. 14 is almost the same as the display device according to the example embodiment shown in FIGS. 1, 2, 3, 4, 5, 6, 7, 8, 9, 10, 11, 12, and 13, and therefore, the same portions will not be described. In the present example embodiment, the position and shape of the color filter layer is different from the previous example embodiment, and will be further described below.

FIG. 14 is a cross-sectional view of a display device according to an example embodiment.

As shown in FIG. 14, a display device according to an example embodiment includes a substrate 100, a semiconductor 131, a transistor TFT including a gate electrode 124, a source electrode 173, and a drain electrode 175, a gate insulating layer 120, an interlayer insulating layer 160, a lower planarization layer 180, a pixel electrode 191, an emission layer 350, a barrier rib 370, a common electrode 270, and an encapsulation layer 400. In addition, the display device according to the example embodiment may further include a detection insulation layer 510, a plurality of touch electrodes 520 and 540, a touch electrode connection portion 541, a light blocking portion 220, and a upper planarization layer 550.

In the above-described example embodiment, the color filter layer 230 is disposed on the detection insulation layer 510, and in the present example embodiment, a color filter layer 230 is disposed below the detection insulation layer 510. In the present example embodiment, the color filter layer 230 may be disposed on the encapsulation layer 400.

The encapsulation layer 400 may include a first inorganic encapsulation layer 410 and an organic encapsulation layer 420. The organic encapsulation layer 420 may include a groove 421. The groove 421 may be formed with a predetermined depth on the top surface of the organic encapsulation layer 420. The groove 421 may overlap the emission layer 350 of each pixel. A width of the groove 421 may be similar to a width of the emission layer 350 of each pixel. For example, the width of the groove 422 may be substantially the same as the width of the emission layer 350 of each pixel.

The color filter layer 230 may be disposed on the encapsulation layer 400. The color filter layer 230 may be formed to fill the groove 421. Thus, the shape of the bottom surface of the color filter layer 230 may be determined by the shape of the groove 421. The color filter layer 230 may include a red filter 230R, a green filter 230G, and a blue filter 230B. Edges of color filter layers 230 adjacent to each other may overlap each other. Not as in the previously described example embodiment, in the present example embodiment, the color filter layer 230 may include a material having a high refractive index. In the present example embodiment, the refractive index of the color filter layer 230 is between about 1.65 or more and about 2.0 or less. The refractive index of the color filter layer 230 may be higher than a refractive index of the organic encapsulation layer 420.

A buffer layer 501 may be disposed on the color filter layer 230. The touch electrode connection portion 541, the detection insulation layer 510, and the plurality of touch electrodes 520 and 540 may be disposed on the buffer layer 501. The light blocking portion 220 may be disposed on the plurality of touch electrodes 520 and 540. A upper planarization layer 550 may be disposed on the detection insulation layer 510 and the light blocking portion 220. The upper planarization layer 550 may include a light-transmitting organic material having a high refractive index. The refractive index of the color filter layer 230 is between about 1.65 or more and about 2.0 or less. The refractive index of the upper planarization layer 550 may be greater than the refractive index of the detection insulation layer 510.

In the present example embodiment, the color filter layer 230 has a higher refractive index that the organic encapsulation layer 420 disposed therebelow, and the upper planarization layer 550 has a higher refractive index than the detection insulation layer 510 disposed therebelow, and thus the front emission efficiency can be improved by changing a path of light generated from the emission layer 350.

While this disclosure has been described in connection with what is presently considered to be practical example embodiments, it is to be understood that the present disclosure is not limited to the disclosed embodiments. On the contrary, it is intended to cover various modifications and equivalent arrangements included within the spirit and scope of the appended claims.

What is claimed is:

1. A display device comprising:
 a substrate;
 a light emitting diode disposed on the substrate, the light emitting diode including a pixel electrode, a common electrode, and an emission layer disposed between the pixel electrode and the common electrode;

an encapsulation layer disposed on the light emitting diode;

a touch electrode disposed on the encapsulation layer;

a light blocking portion disposed on the touch electrode;

a color filter layer overlapping the emission layer; and a planarization layer overlapping the light blocking portion and the color filter layer, wherein the color filter layer overlaps the encapsulation layer, the light blocking portion, and the touch electrode, an edge portion of the color filter layer overlaps the light blocking portion, the color filter layer has a convex shape over the light blocking portion, and a refractive index of the planarization layer is higher than a refractive index of the color filter layer.

2. The display device of claim 1, wherein a refractive index of the planarization layer is between 1.65 and 2.0.

3. The display device of claim 2, wherein a refractive index of the color filter layer is between about 1.5 and about 1.7.

4. The display device of claim 2, wherein the color filter layer has a concave shape in a center portion of the color filter.

5. The display device of claim 2, wherein a height of the center portion of the color filter layer is lower than a height of an edge portion of the color filter layer.

6. The display device of claim 1, wherein the planarization layer comprises an organic insulating material and a nano-composite.

7. The display device of claim 6, wherein the planarization layer comprises at least one of $TiO_2$, $Al_2O_3$, $SiO_2$, $Al_2TiO_3$, $ZrO_2$, PbS, and ZnS.

8. The display device of claim 1, wherein the color filter layer includes a first color filter and a second color filter, and the first color filter and the second color filter at least partially overlap each other.

9. The display device of claim 8, wherein an edge of the first color filter overlaps an edge of the second color filter.

10. The display device of claim 9, wherein the first color filter and the second color filter overlap an entirety of the light blocking portion.

11. A display device comprising:

a substrate;

a light emitting diode disposed on the substrate, the light emitting diode includes a pixel electrode, a common electrode, and an emission layer disposed between the pixel electrode and the common electrode;

an encapsulation layer disposed on the light emitting diode;

a touch electrode disposed on the encapsulation layer;

a light blocking portion disposed on the touch electrode;

a color filter layer disposed on the encapsulation layer and the light blocking portion, the color filter layer overlaps the emission layer; and a planarization layer disposed on the light blocking portion and the color filter layer, wherein a height of a center portion of the color filter layer is lower than a height of an edge portion of the color filter layer, the color filter layer has a convex shape over the light blocking portion, and a refractive index of the planarization layer is higher than a refractive index of the color filter layer.

12. The display device of claim 11, wherein a refractive index of the planarization layer is between 1.65 and 2.0.

13. The display device of claim 11, wherein the planarization layer includes an organic insulating material and a nano-composite.

14. The display device of claim 13, wherein the planarization layer includes at least one of $TiO_2$, $Al_2O_3$, $SiO_2$, $Al_2TiO_3$, $ZrO_2$, PbS, and ZnS.

* * * * *